United States Patent [19]
Le Fevre

[11] 3,787,788
[45] Jan. 22, 1974

[54] VARACTOR TUNER BAND SWITCHING AND SIGNAL INDICATING CIRCUITRY

[75] Inventor: Paul Eshelman Le Fevre, Pavilion, N.Y.

[73] Assignee: GTE Sylvania Incorporated, Seneca Falls, N.Y.

[22] Filed: Jan. 26, 1973

[21] Appl. No.: 326,829

[52] U.S. Cl. .......... 334/14, 334/47, 334/86, 334/87

[51] Int. Cl. .......... H03j 3/06

[58] Field of Search .......... 334/14, 15, 86, 47, 87

[56] References Cited

UNITED STATES PATENTS

| | | | |
|---|---|---|---|
| 3,673,523 | 6/1972 | Russell | 334/15 |
| 3,678,421 | 7/1972 | Ono | 334/15 |
| 3,665,318 | 5/1972 | Hoffman et al. | 334/86 |
| 3,593,152 | 3/1971 | Aoki | 334/86 |
| 3,354,397 | 11/1967 | Wittig | 334/15 X |

*Primary Examiner*—James W. Lawrence
*Assistant Examiner*—Saxfield Chatmon, Jr.
*Attorney, Agent, or Firm*—Norman J. O'Malley; Thomas H. Buffton; Cyril A. Krenzer

[57] ABSTRACT

A signal receiver having VHF and UHF varactor tuners and a channel indicating group for the upper and lower VHF channels and for the UHF channel includes band switching circuitry for selectively coupling a plurality of power sources to the tuners in accordance with activation of a particular channel indicating group. Also, the band switching circuitry is utilized in conjunction with a channel indicating meter circuit for providing a visual indication of the channel selected in each one of the channel indicating groups.

9 Claims, 2 Drawing Figures

VARACTOR TUNER BAND SWITCHING AND SIGNAL INDICATING CIRCUITRY

CROSS-REFERENCE TO OTHER APPLICATIONS

An application entitled "Pushbutton Tuning System" filed concurrently herewith in the names of William Lee Arrington and Lee Irving Merz (Ser. No. 326,759) and assigned to the assignee of the present application relates to a pushbutton tuner for selecting a signal channel wherein each one of the channels provide an output potential suitable for use with the band switching and channel indicating meter circuitry set forth in the present application.

BACKGROUND OF THE INVENTION

Generally, present-day television receivers utilize both VHF and UHF tuners with the VHF tuner having the usual upper band portion covering channels 7–13 and a lower band portion covering channels 2–6. Also, present-day tuners are commonly of the varactor type wherein channel or frequency selection is determined by the potentials applied to the tuners.

In the prior art it has been a common practice to provide ordinary mechanical switches for band switching the high and low bands of the VHF tuner and the UHF tuner. Moreover, printed circuit type switches have been utilized in an effort to overcome the usual problems associated with mechanical switches. However, printed circuits have not provided the answers for such mechanical problems as wear, contact failure, and lack of reliability even though the cost is undesirably increased.

Additionally, total electronic tuning systems using logic and digital techniques have been proposed for use with varactor tuners. In one known example, channel numbers are coded into binary numbers and the selection of a preset voltage on varactor diodes is made by a corresponding binary coded signal.

However, electronic tuning systems using logic and digital systems appear to be relatively expensive, require a large number of components, and have a reliability and repeatability factor which is relatively unknown in the industry. Moreover, repair and service problems associated with such a departure from known and more frequently employed techniques remains an unknown factor.

Additionally, it is highly desirable to provide some form of visual indicating apparatus whereby an operator is aware of the approximate tuning of the receiver. Obviously, the provision of such visual indicating apparatus at a minimum cost of materials and labor is of utmost importance.

OBJECTS AND SUMMARY OF THE INVENTION

An object of the present invention is to provide enhanced band switching circuitry for a multi-band signal receiver. Another object of the invention is to provide improved electronic band switching circuitry for varactor tuners in a signal receiver. Still another object of the invention is to provide improved visual indicating apparatus utilized with band switching circuitry in a multiband signal receiver.

These and other and further objects, advantages and capabilities are achieved in one aspect of the invention by a multi-band signal receiver having VHF and UHF varactor tuners with channel indicating groups for the upper and lower VHF bands and the UHF band and band switching circuitry for selectively coupling a plurality of potential sources to the tuners in accordance with the particular channel indicating group selected. Also, channel indicating meter circuitry acts in conjunction with the band switching circuitry to provide a visual indication of the signal channel selected.

PREFERRED EMBODIMENT OF THE INVENTION

Figures 1, 2:
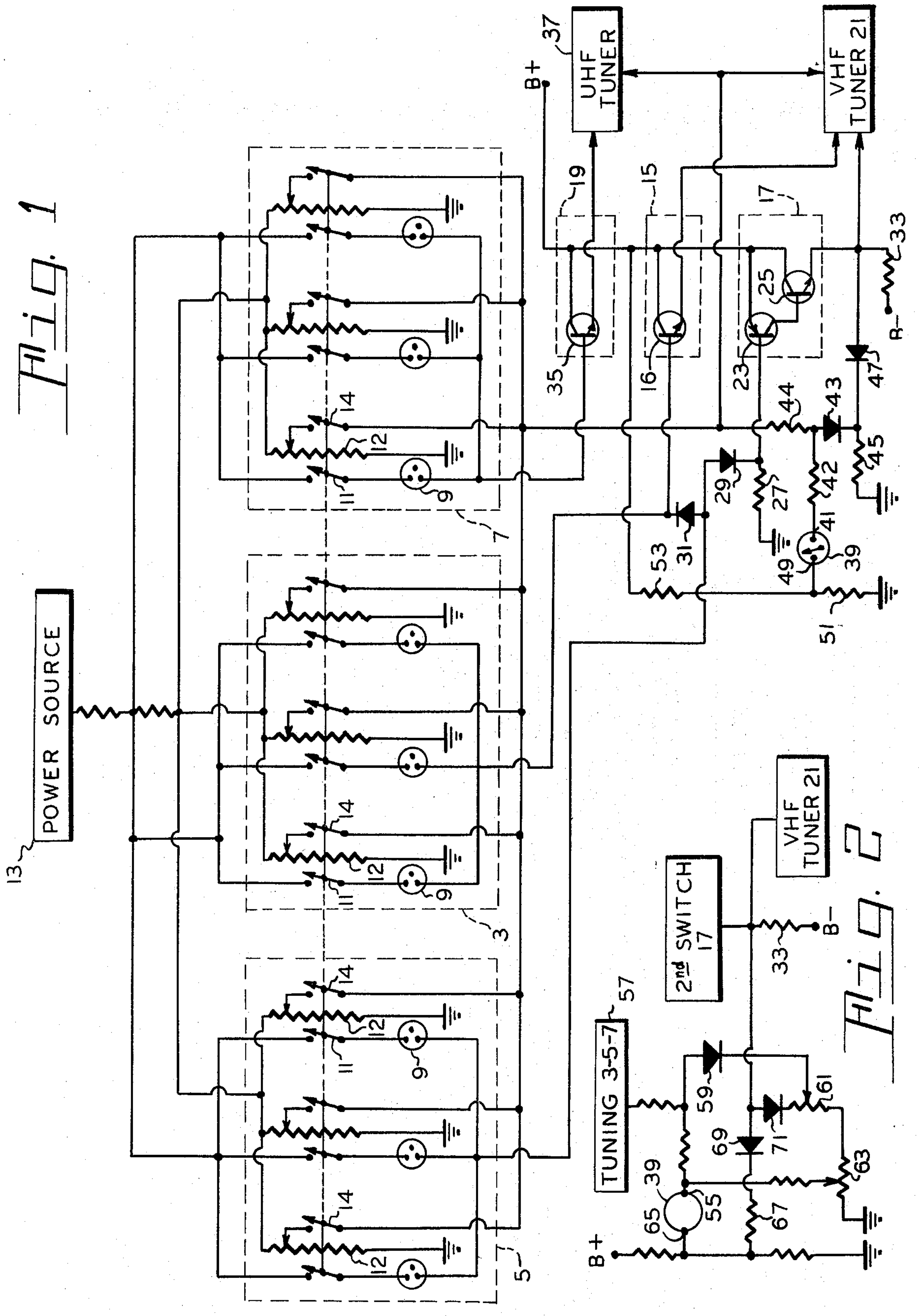
FIG. 1 is a diagrammatic illustration, in block and schematic form, of electronic band switching and channel indicating meter circuitry suitable for use in a multiband signal receiver.
FIG. 2 is an alternative embodiment of a channel indicating meter circuit.

For a better understanding of the present invention, together with other and further objects, advantages and capabilities thereof, reference is made to the following disclosure and appended claims in conjunction with the accompanying drawings.

Referring to the drawings, band switching and channel indicating meter circuitry suitable for use in a television receiver includes first, second, and third channel indicating groups 3, 5, and 7 respectively. Each one of the channel indicating groups, 3, 5, and 7 includes a plurality of parallel coupled signal channels and each signal channel has a series connected neon bulb 9 and selector switch 11 coupled to a first potential source 13. Also, each channel includes a signal selector switch 14, ganged to the selector switch 11, and connected to an adjustable resistor 12 intermediate the first potential source 13 and a potential reference level such as circuit ground. Thus, the first channel indicating group 3, preferably includes signal channels 7–13, the second channel indicating group 5, includes signal channels 2–6, and the third channel indicating group 7 includes a selection of channels 14–83.

In operation, selection of a signal channel in any one of the first, second, or third channel indicating groups 3, 5, and 7 is effected upon closure of a selector switch 11 whereupon a potential from the first potential source 13 is applied to the series connected neon bulb 9 by the selector switch 11. Also, a potential representative of a signal channel within the channel indicating group 3, 5, and 7 is available at the ganged signal selector switch 14. Thus, there is provided a potential representative of the channel indicating group and another potential representative of a specific channel within the channel indicating group.

Coupled to the channel indicating groups 3, 5, and 7 respectively, is band switching circuitry including first, second, and third switching means 15, 17, and 19 respectively. The first switching means 15, in the form of a transistor 16 in this instance, has a base electrode coupled to the first channel indicating group 3, representative of the upper band of signal channels 7–13. A collector electrode is coupled to a second potential source B+ while an emitter electrode is coupled to a varactor or varicap VHF type tuner 21. Obviously, the transistor may be replaced by other forms of electronic switching apparatus.

The second switching means 17 includes a pair of DC coupled PNP and NPN transistors, 23 and 25 respectively. The PNP transistor 23 has an emitter coupled to the second potential source B+, a collector DC coupled to the base of the NPN transistor 25, and a base electrode coupled via a biasing resistor 27 to circuit ground and by way of a first unidirectional conduction device 29 to the second channel indicating group 5 (channels 2–6). Also, a second unidirectional conduction device 31 couples the junction of the first unidirectional conduction device 29 and second channel indicating group 5 to the junction of the first channel indicating group 3 and first switching means 15. The NPN transistor 25 has a collector electrode coupled to the second potential source B+ and an emitter electrode coupled via a resistor 33 to a third potential source B– and to the VHF varactor or varicap tuner 21.

The third switching means 19 includes a transistor 35 having a base electrode connected to the third channel indicating group 7 and a collector electrode coupled to the second potential source B+. The emitter electrode of the transistor 35 is coupled to a UHF varicap or varactor tuner 37.

Additionally, channel indicating meter circuitry includes a meter 39 having a first terminal 41 coupled via resistors 42 and 44 to the signal selector switches 14 of the series connected first, second, and third channel indicating groups 3, 5, and 7 respectively and to the junction of the VHF and UHF tuners 21 and 37. This first terminal 41 of the meter 39 is also connected via a series connected first unidirectional conduction device 43 and resistor 45 to circuit ground. The junction of this first unidirectional conduction device 43 and resistor 45 is coupled via a second unidirectional conduction device 47 to the junction of the second switching means 17, the resistor 33 connected to the third potential source B–, and to the VHF tuner 21. Moreover, a second terminal 49 of the indicating meter 39 is coupled by a first resistor 51 to a potential reference level and by a second resistor 53 to the second potential source B+.

FIG. 2 illustrates an alternative form of channel indicating circuitry wherein an indicating meter 39 has a first terminal 55 coupled to the signal indicating or tuning means 57 of the first, second, and third channel indicating groups 3, 5, and 7 and via a series connected diode 59, first alterable resistor 61, and second alterable resistor 63 to a potential reference level. The terminal 55 is also coupled to the second alterable resistor 63.

A second terminal 65 of the meter 39 is coupled to the second potential source B+ and to the potential reference level. Also, the second terminal 65 is coupled via a resistor 67 and diode 69 to the junction of the second switching means 17, to the resistor 33 coupled to the third potential source B–, and to the VHF tuner 21. Moreover, a third diode 71 couples the second diode 69 and junction of the second switching means 17 to the alterable resistor 61.

As to operation, selection of any one of the parallel connected signal channels (channels 7–13) of the first channel indicating group 3 causes application of a potential from the first potential source 13 to the first switching means 15. The first switching means 15 including the transistor 16 is normally nonconductive or open-circuited. However, application of a potential from the potential source 13 renders the transistor 16 conductive whereupon a potential from the second potential source B+ is applied to the VHF tuner 21.

Also, it is to be noted that the second switching means 17 is normally conductive whereupon the potential from the third potential source B– coupled to the VHF tuner 21 is "swamped-out" by the potential from the second potential source B+. Thus, activation of a signal channel (channels 7–13) of the first channel indicating group 3 causes application of a potential from the second potential source B+ to the VHF tuner 21 and "swamping-out" of a potential from the third potential source B– which is, in turn, coupled to the band switching terminal of the VHF tuner 21.

Activation of a parallel connected signal channel of the second channel indicating group 5 which includes the low portion (channels 2–6) of the VHF signal band, causes application of a potential from the first potential source 13 to the first switching means 15 via the diode 31 and to the second switching means 17 via diode 29. Thereupon, the first switching means 15 is rendered conductive and a potential from the second potential source B+ is applied to the VHF tuner 21. The second switching means 17 is rendered non-conductive, due to the bias potential developed across the resistor 27 via diode 29, whereupon the third potential source B– is no longer "swamped-out" but rather, is applied to the band switching terminal of the VHF tuner 21.

Selection of one of the parallel connected signal channels (channels 14–83) in the UHF band of signals causes activation of the third channel indicating group 7. Thereupon, a potential from the first potential source 13 is applied to the third switching means 19. This applied potential renders the transistor 35 conductive whereupon a potential from the second potential source B+ is applied to the UHF tuner 3. Thus, activation of the UHF tuner 3 is provided upon selection of a high frequency signal channel (channels 14–83).

It may be noted that each one of the switches 11 in each channel of the first, second, and third channel indicating groups 3, 5, and 7 is mechanically connected to the others in a manner such that only one of the switches 11 is operable at a time. In other words, activation of a second one of the switches 11 causes deactivation of a first one of the switches 11. Such a switching system is clearly set forth in the cross-referenced application entitled "Pushbutton Tuning System" filed concurrently herewith.

Additionally, the channel indicating meter circuitry is responsive to selection of a channel in any one of the first, second, and third channel indicating groups 3, 5, and 7. Upon selection of a channel (channels 7–13) in the upper portion of the VHF signal range, a positive potential provided by second potential source B+ will appear at the junction of the second switching means 17, resistor 33 coupled to the third potential source B–, and the band switching terminal of the VHF tuner 21. This positive potential appears at the junction of the first and second unidirectional conduction devices 43 and 47 back biasing the first unidirectional conduction device 43 whereupon conduction therethrough ceases and the potential of the first terminal 41 of the indicating meter 39 is raised to provide an approximate half-scale reading of the channel indicating meter 39. The indicating meter 39 is further advanced in accordance with a potential applied to the first terminal 41 via the series connected resistors 42 and 44 coupled to the particular channel (channels 7–13) selected. Thus, this further advance of the indicating meter 39 is effected by current flow via the series connected resistors 44 and 42, the indicating meter 39 and the resistor 51 coupled to circuit ground.

Upon selection of a channel (channels 2–6) in the lower portion of the VHF signal band, the third potential source B− is no longer "swamped-out" because of the non-conductivity of the second band switching circuitry 17 but rather, is applied to the second unidirectional conduction device 47 to effect a back-bias thereon. Thus, current supplied by the tuning voltage, derived via the first potential source 13 and second channel indicating group 5, flows through the indicating meter 39 via the resistors 44 and 42 and to circuit ground by way of the resistor 51. Also, a predetermined portion of this current flows to circuit ground by way of the first unidirectional conduction device 43 and resistor 45 coupled thereto. Thus, compression to the lower portion of the scale of the indicating meter 39 provides a maximum utilization of scale length.

In the UHF signal band (channels 14–83), a positive potential appears at the first terminal 41 as previously explained with respect to the upper portion (channels 7–13) of the VHF signal band. Also, a substantially equal positive potential is applied to the second terminal 49 of the indicating meter 39 as derived from the second potential source B+ via the resistor 53 coupled to the second terminal 49. Thus, by application of substantially equal potentials to the first and second terminals 41 and 49 of the indicating meter 39, the total length of the indicating scale may be employed. Moreover, the tuning voltage, as derived from the first potential source 13 and third channel indicating group 7, is applied via the resistors 44 and 42 to the first terminal 41 of the indicating meter 39 to provide a visual indication of the channel selected.

Thus, there has been provided a unique band switching circuit as well as a unique channel indicating meter circuit for a multi-channel signal receiver employing both VHF and UHF varicap or varactor tuners. This improved circuitry is inexpensive of components, circuitry, and assembly time while reliability and repeatability of results are enhanced. Not only is the undesired wear associated with mechanical systems eliminated but, more importantly, the electronic switching technique increases the time switching capabilities without appreciable increase in cost.

While there has been shown and described what is at present considered the preferred embodiment of the invention, it will be obvious to those skilled in the art that various changes and modifications may be made therein without departing from the invention as defined by the appended claims.

What is claimed is:

1. In a signal receiver having first, second, and third potential sources; VHF and UHF varactor tuners; first, second, and third channel indicating groups formed for selective coupling to the first potential source; and band switching circuitry having first, second, and third switching means for coupling the potential sources to the VHF and UHF tuners, channel indicating meter circuitry comprising:

a channel indicating meter having a pair of terminals;

means for coupling one of said pair of terminals to said channel indicating groups, to a potential reference level, and via diode means to the junction of said second switching means and third potential source; and means for coupling the other one of said pair of terminals to said second potential source and to a potential reference level whereby activation of said band switching circuitry effects alterations in potential applied to said meter terminals.

2. The channel indicating meter circuitry of claim 1 wherein said means for coupling one of said pair of terminals of said channel indicating meter to a potential reference level and to the junction of said second switching means and third potential source includes a first unidirectional conduction device coupled intermediate said terminal and said potential reference level and a second unidirectional conduction device coupling the junction of said first unidirectional conduction device and potential reference level to said junction of said second switching means and third potential source.

3. The channel indicating meter circuitry of claim 1 wherein said means for coupling the other one of said pair of terminals of said channel indicating meter includes a first impedance coupling said terminal to a potential reference level and a second impedance coupling said terminal to said third switching means.

4. The channel indicating meter circuitry of claim 1 wherein said channel indicating meter provides a visual indication of a selected signal channel in accordance with the potential applied thereto from said channel indicating groups and said band switching circuitry.

5. The channel indicating meter circuitry of claim 1 wherein said channel indicating meter includes a plurality of meter scales for visually indicating channels in the upper and lower bands of the VHF varactor tuner and the UHF tuner.

6. In a signal receiver having first, second, and third potential sources; VHF and UHF varactor tuners; first, second, and third channel indicating groups each formed for selective coupling to a first potential source, band switching and channel indicating meter circuitry comprising in combination:

first switching means coupled to said first channel indicating group and intermediate said second potential source and said VHF varactor tuner;

second switching means coupled to said second channel indicating group, to said first switching means by a unidirectional conduction device, intermediate said second and third potential sources, and to said VHF tuner;

third switching means coupled to said third channel indicating group and intermediate said second potential source and said UHF tuner; and channel indicating meter means having a meter with a first terminal coupled to said second potential source and a potential reference level and a second terminal coupled to said first, second, and third channel indicating groups; said potential reference level; and via diode means to the junction of said second switching means and said third potential source.

7. The band switching and channel indicating meter circuitry combination of claim 6 including a first impedance coupling said first terminal to said potential reference level and a second impedance coupling said first terminal to said third switching means.

8. The band switching and channel indicating meter circuitry combination of claim 6 including a first unidirectional conduction device coupling said second terminal to said potential reference level.

9. The band switching and channel indicating meter circuitry combination of claim 6 including a first unidirectional conduction device coupling said second terminal to said potential reference level and a second unidirectional conduction device coupled to said first unidirectional conduction device and potential reference level and to said second switching means and third potential source.

* * * * *